United States Patent
Arai et al.

(10) Patent No.: US 6,359,429 B1
(45) Date of Patent: Mar. 19, 2002

(54) MEASURING METHOD USING A SPECTRUM ANALYZER

(75) Inventors: Michiaki Arai; Takashi Kosuge, both of Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 09/179,023

(22) Filed: Oct. 26, 1998

(30) Foreign Application Priority Data

Oct. 27, 1997 (JP) .............................................. 9-294350

(51) Int. Cl.[7] .............................................. G01R 23/16
(52) U.S. Cl. .................... 324/76.23; 324/76.19
(58) Field of Search .......................... 324/76.19, 76.26, 324/76.27, 76.41, 76.44, 76.45, 120, 76.23, 76.21

(56) References Cited

U.S. PATENT DOCUMENTS

| | | | | |
|---|---|---|---|---|
| 4,578,638 A | * | 3/1986 | Takano et al. ............ | 324/76.23 |
| 4,607,216 A | * | 8/1986 | Yamaguchi et al. ..... | 324/76.21 |
| 4,611,164 A | * | 9/1986 | Mitsuyoshi et al. ..... | 324/76.19 |
| 4,890,237 A | | 12/1989 | Bales et al. .................. | 364/485 |
| 4,998,217 A | | 3/1991 | Holcomb et al. ........... | 364/573 |
| 5,210,483 A | * | 5/1993 | Amamoto et al. ....... | 324/76.27 |
| 5,475,709 A | * | 12/1995 | Futagami et al. .......... | 375/224 |
| 5,706,202 A | * | 1/1998 | Itahara et al. ................. | 702/77 |
| 5,736,845 A | * | 4/1998 | Kosuge .................... | 324/76.27 |
| 5,818,215 A | * | 4/1998 | Miyamae et al. ........ | 324/76.27 |
| 5,808,463 A | * | 9/1998 | Nagano ................... | 324/76.21 |

FOREIGN PATENT DOCUMENTS

| | | |
|---|---|---|
| DE | 2831407 | 1/1980 |
| DE | 19615651 | 10/1996 |
| DE | 9635890 | 3/1997 |
| DE | 19623304 | 4/1997 |
| EP | 0364771 | 4/1990 |

OTHER PUBLICATIONS

Timko, M. and Holloway, P., "Complete 12–Bit –CHIP IC A/D Converter," *Analog Dialogue*, Dec. 3, 1978.

Burton, P. and Stephenson, S., "3 New CMOS Monolithic Multiplying DAC's," Analog Dialogue, Dec. 3, 1978.

* cited by examiner

*Primary Examiner*—Safet Metjahic
*Assistant Examiner*—Vincent Q. Nguyen
(74) *Attorney, Agent, or Firm*—Gallagher & Lathrop; David N. Lathrop, Esq.

(57) ABSTRACT

A method for automatically setting a reference level is provided. A frequency-converted output of frequency converter 13 is branched and the branched output is further frequency-converted by another frequency converter 33. The thus frequency-converted signal is converted to a digital signal by an AD converter 31 and the digital signal is once stored in a memory 35. The digital data is read out from the memory 35 and a check is made to see if the AD converter 31 was overflown. If the AD converter 31 was overflown, an attenuation amount of a first stage attenuator 12 is increased from an initially set value to acquire a data again. If the AD converter 31 was not overflown, a check is made to see if a peak value of the digital data is within a range of 85%–65% of the full scale of the AD converter 31. If a peak value of the digital data is not within the range of 85%–65% of the full scale, a calculation is performed to increase/decrease the gain of an amplifier 15. If a peak value is within the range, this value is set as a reference level.

12 Claims, 4 Drawing Sheets

MEASURING METHOD USING A SPECTRUM ANALYZER

BACKGROUND OF THE INVENTION

1. Field of the Invention

The present invention relates to a measuring method using a spectrum analyzer, and more particularly, to a method for setting an input level (reference level) of a spectrum analyzer, a method for measuring a carrier (or carrier wave) power of an input signal and a method for measuring a spurious power or a leakage power to adjacent channels.

2. Description of the Related Art

In a conventional measuring method using a spectrum analyzer, it is required to set an input level, namely a reference level of the spectrum analyzer so that a proper measurement can be performed. For this setting, the spectrum analyzer is maintained in a sweep measurement state and a variable attenuator at the input stage is adjusted observing the measured level displayed on a display to maintain a secondary harmonic level in unchanged state. That is, by this adjustment operation, a secondary distortion generated by first stage frequency converting means can be neglected and an input signal is maintained, in the first stage frequency converting means, in undistorted state.

In the case of measuring a spurious power or a leakage power to adjacent channels, a carrier power of an input signal is first measured. In the measurement of a carrier power, a carrier power is obtained by a so-called sample detector wherein a measuring central frequency of a spectrum analyzer is matched with the carrier frequency of the input signal and an indication on a frequency axis on the display screen determined by a set sweep speed is sampled to calculate a power from each sample value at that frequency.

After that, a spurious signal is searched, in the state that the spectrum analyzer is maintained in a frequency sweep mode, to measure a spurious power. Alternatively, a leakage power to adjacent channels defined is measured in accordance with an input signal in the frequency sweep mode.

This measured spurious power or leakage power to adjacent channels is converted to a relative value to the carrier power obtained as described above. The relative value of the spurious power or the leakage power to adjacent channels is checked whether or not this value is less than a predetermined value to judge goodness or badness of the measurement result.

As described above, in the prior art, an operator observes a secondary distortion power by setting a reference level of a spectrum analyzer to, for example, a minimum value and thereafter, the reference level is manually changed until its secondary distortion power becomes a constant value (no changing state) and the reference level the secondary distortion power of which is constant is used as a proper reference level, namely an input level. Therefore, there has been a problem that it takes a long time period and a large workload for setting a proper reference level.

In addition, in the prior art, as described above, a carrier power is measured by a sample detector. In the sample detector, since the sample values have a relatively wide dispersion, a plurality of sweep operations are performed to obtain an average value of the sample values and the average value is used as a measured value of a carrier power.

Moreover, since, in a sample detector, a sample data displayed on a display is used as mentioned before, i.e., since an output of a logarithmic amplifier is detected by a detector and a sample data of the detected output is used, a carrier power is obtained by averaging a plurality of sweep operation results from the stand point of avoiding the influence of errors of the logarithmic amplifier and the detector. As described above, in the prior art, since a plurality of sweep operations are necessary, there is a drawback that it takes a long time period and a large workload in the measurement of a carrier power.

SUMMARY OF THE INVENTION

It is an object of the present invention to provide a measuring method using a spectrum analyzer wherein a reference level of the spectrum analyzer can automatically be set.

It is another object of the present invention to provide a measuring method using a spectrum analyzer wherein a carrier power of an input signal can accurately be measured in a short time period without requiring a plurality of sweep operations.

According to the present invention, there is branched an output of frequency converting means for frequency selection in the spectrum analyzer, the branched output is converted into a digital data, a check is made to see if AD converting means for converting the branched output into the digital data has overflowed, and if the AD converting means has overflowed, first stage level adjusting means of the spectrum analyzer is adjusted to prevent the overflow from occurring. In such a manner, a reference level is automatically set.

Further, after the adjustment of the level adjusting means, an output level of the frequency converting means for frequency selection is adjusted in a smaller unit than an adjusting unit of the first stage level adjusting means such that a peak value of the digital data falls within a predetermined range in the full scale of the AD converting means, namely, such that an input level of the AD converting means is always within the proper input level range of the AD converting means.

In a measurement of a carrier power, a measuring central frequency of the spectrum analyzer selected by the frequency converting means for frequency selection is set to a carrier frequency of an input signal and a sweep of measuring frequencies is stopped, and a carrier power of the input signal is calculated from the digital data.

Alternatively, the digital data is demodulated and based on the demodulated data, a carrier power is calculated for a sample of the digital data predetermined with respect to the input signal.

Measuring frequencies are swept in the state that the measuring central frequency is set to the carrier frequency of the input signal to measure a spurious power or a leakage power to adjacent channels.

A standardized template in accordance with the input signal is displayed based on the carrier power, and a spectrum measured by sweeping the measuring frequencies is displayed overlapping with the template.

DETAILED DESCRIPTION OF THE PREFERRED EMBODIMENTS

The measuring method according to the present invention will be explained below in detail with reference to appended drawings.

Figure 1:
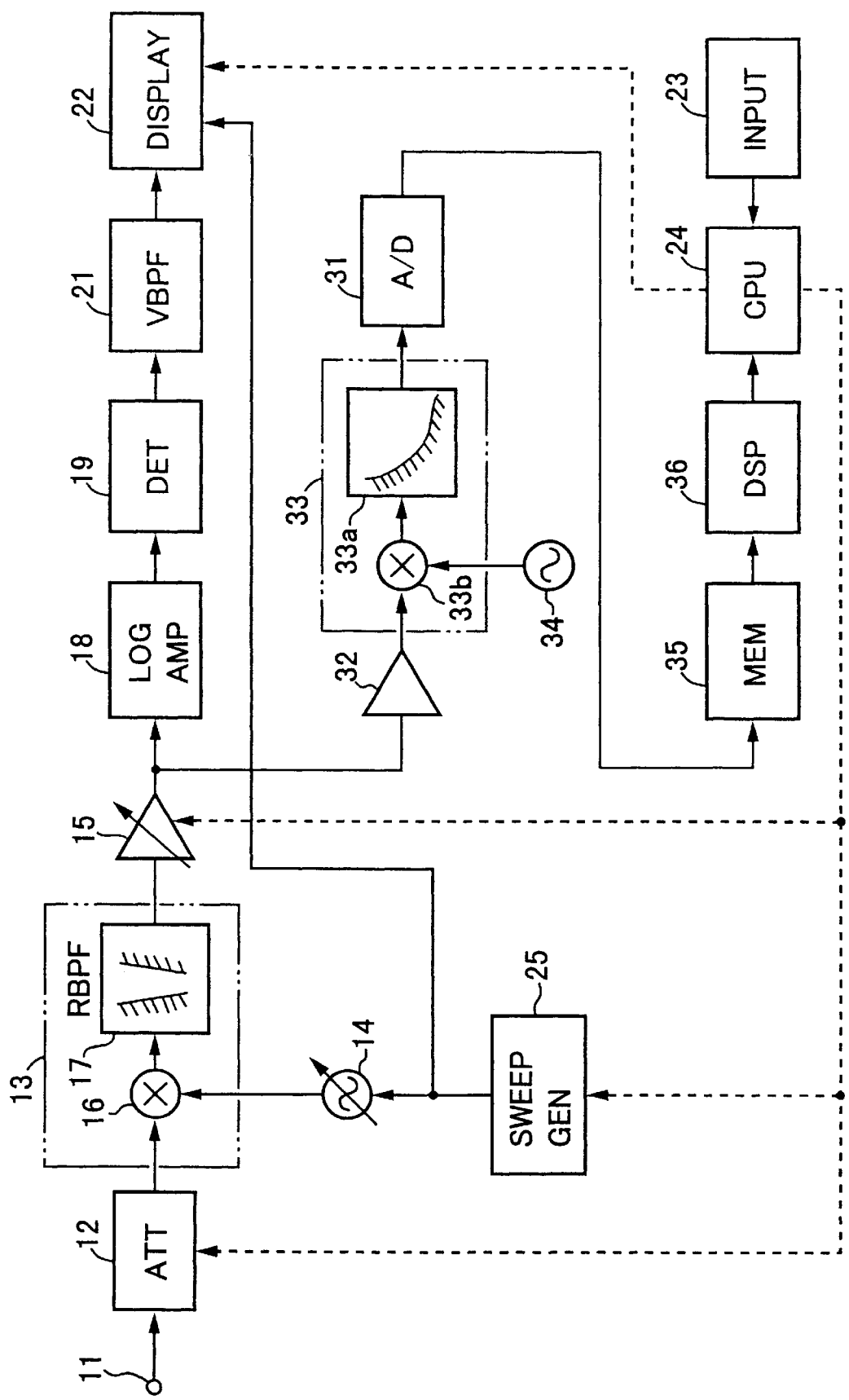
FIG. 1 is a block diagram showing a specific example of a spectrum analyzer to which a first embodiment of the measuring method according to the present invention is applied.

FIG. 1 is a block diagram showing a specific example of a spectrum analyzer to which a first embodiment of the measuring method according to the present invention is applied. This spectrum analyzer includes a variable attenuator 12 for adjusting level of an input signal supplied from an input terminal 11, a frequency converter for frequency selection (hereinafter, simply referred to as a frequency converter) 13 to which the input signal whose level has been adjusted by the variable attenuator 12 is supplied, a sweep oscillator 14 for supplying a local signal to the frequency converter 13, and a variable gain amplifier 15 to which the input signal whose frequency has been converted by the local signal from the sweep oscillator 14 is supplied.

The variable attenuator 12 functions as first stage level adjusting means. The first stage frequency converter 13 comprises a frequency mixer 16 for mixing the input signal and the local signal from the sweep oscillator 14 to generate a signal having a difference of a summed frequency between the input signal and the local signal, and a band pass filter (RBPF) 17 for passing therethrough a predetermined difference (or summed) frequency band component out of the output signal of the frequency mixer 16. The difference (or summed) frequency signal passed through the band pass filter 17 is supplied to the variable gain amplifier 15. The variable gain amplifier 15 functions as intermediate stage level adjusting means.

The output of the variable gain amplifier 15 is supplied to a logarithmic amplifier 18 and the level range of the output is compressed/amplified by the logarithmic amplifier 18. The amplified output from the logarithmic amplifier 18 is detected by a detector 19 and the detected output of the detector 19 is supplied to a display 22 via a video band pass filter (VBPF) 21.

When a measuring frequency band, a measuring band width, a sweep speed, a measurement mode and a reference level etc. are inputted to a CPU(central processing unit) 24 through an input means 23 such as a keyboard or the like and are set therein, in response to the input of those data, the CPU 24 executes a process in accordance with a program to control, for example, a sweep signal generator 25. The oscillation frequency of the sweep oscillator 14 is controlled by the sweep signal generated by the sweep signal generator 25. In addition, the display 22 is controlled by the sweep signal to display a spectrum of the input signal on the display 22.

When a reference level of a spectrum analyzer is set by the input means 23, the CPU 24 responsively controls the variable attenuator 12 and the variable gain amplifier 15 to compress or expand a dynamic range of the input signal level. Further, although not shown in FIG. 1, the output of the variable gain amplifier 15 is usually frequency-converted one or more times and then supplied to the logarithmic amplifier 18. In addition, there may be a case in which the output of the video band pass filter 21 is converted to a digital data and is stored in a memory, and thereafter the digital data is supplied to the display 22 to be displayed thereon. The configuration described above is the same as that of the conventional spectrum analyzer.

In the spectrum analyzer shown in FIG. 1 to which the measuring method according to the present invention is applied, the output of the variable gain amplifier 15 is branched and is converted to a digital data by an AD (analog-digital) converter 31. In this case, in order to make the frequency of the branched output to have such a frequency which can be converted by the AD converter 31, namely in order to make the frequency of the branched output less than ½ frequency of the sampling frequency of the AD converter 31, the spectrum analyzer is constructed such that the branched output from the variable gain amplifier 15 is supplied, if necessary, to a frequency converter 33 via a substantially pre-fixed gain amplifier 32, where the branched output is frequency-converted using a local signal from a local oscillator 34, and thereafter the frequency-converted output signal is supplied to the AD converter 31. The frequency converter 33 comprises a frequency mixer 33b for mixing the output signal from the substantially pre-fixed gain amplifier 32 with the local signal from the local oscillator 34 to convert the output signal to a signal having a difference or summed frequency of the output signal and the local signal, and a low pass filter 33a for passing therethrough a predetermined low frequency component out of the output signal of the frequency mixer. Further, the low pass filter 33a inhibits a frequency component having frequency equal to or higher than ½ of the sampling frequency of the AD converter 31 from being inputted to the AD converter 31.

The digital data from the AD converter 31 is stored once in a memory 35, and thereafter the digital data is processed by a DSP (digital signal processor) 36.

Figure 2:
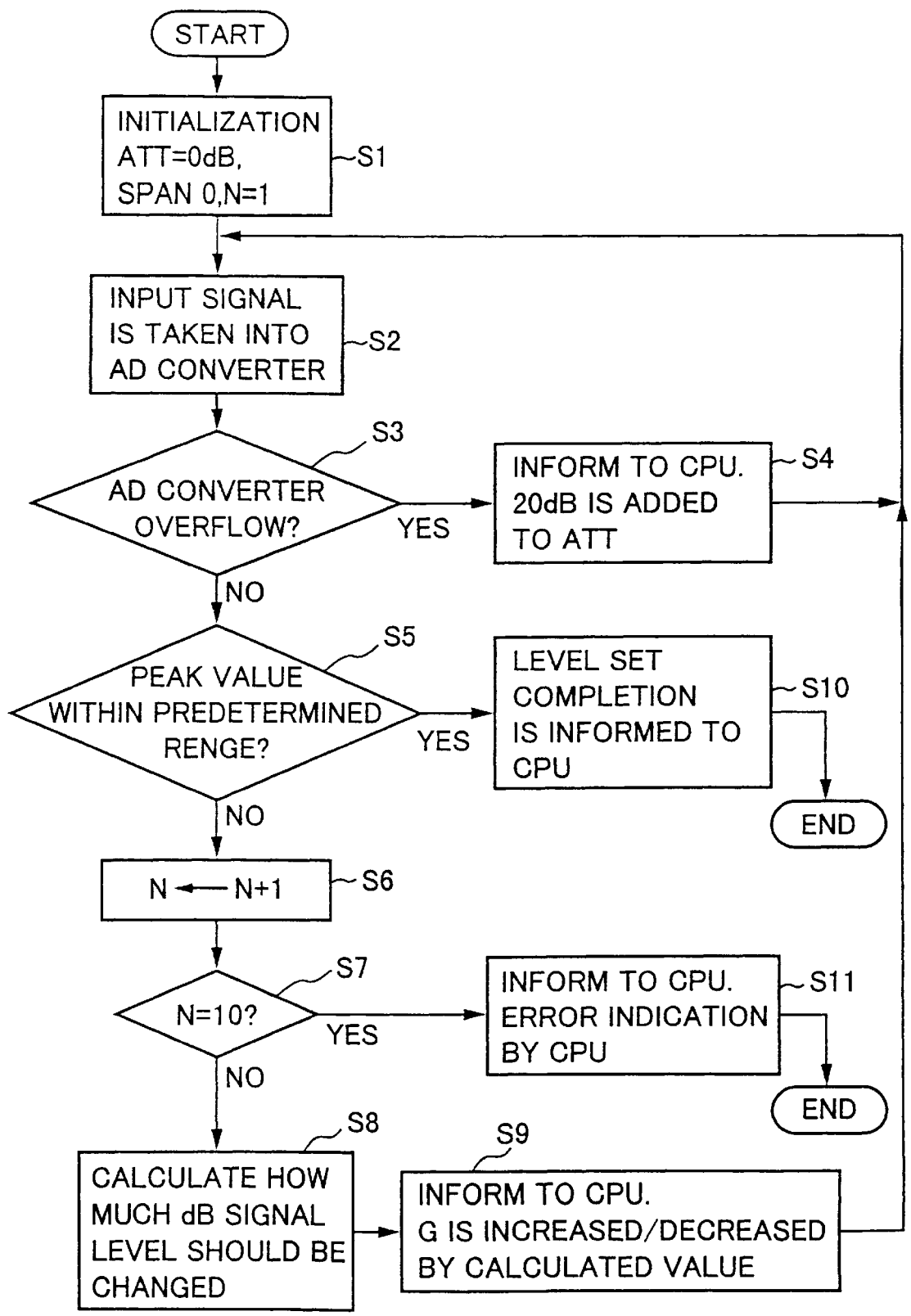
FIG. 2 is a flow-chart showing an example of the processing procedure for automatically setting a reference level of the spectrum analyzer shown in FIG. 1.

The setting process of a reference level is first performed by the DSP 36, namely the dynamic range of an input signal is properly set. For example, as shown in FIG. 2, at the initialization, the attenuation amount ATT of the first stage variable attenuator 12 is set to 0 dB (ATT=0 dB), the gain G of the variable gain amplifier 15 is set to a mid point GM of the control range, the measuring central frequency is set to the carrier frequency fc of the input signal, the sweep width (span) is set to 0 (zero), and N (the number of setting times) is set to 1 (step S1). Further, it is also possible to acquire an input signal by performing a frequency sweep and to obtain a peak level and then to automatically obtain the carrier frequency of the input signal.

After this initialization, the input signal is taken into the AD converter 31 and further, the digital signal outputted from the AD converter 31 is stored in the memory 35 (step S2). The digital signal stored in the memory 35 is read out and a check is made to see if the AD converter 31 has overflowed (step S3). If the AD converter 31 was overflown (YES), the overflow is informed to the CPU 24 (step 4). In the step S4, the CPU 24 sets an attenuation amount ATT to a predetermined value, i.e., for example, 20 dB (ATT=20 dB) which is a value added by 20 dB to the initial set value 0 dB and the process returns to the step S2. Therefore, the input signal taken into the AD converter 31 has a level value which is attenuated by 20 dB from the original input level.

In step S3, if the AD converter has not overflowed (NO), a check is made to see if the peak value of the acquired digital data is within a predetermined appropriate range of the full scale of the AD converter 31, i.e., for example, within the range of 85%–65 % of the full scale of the AD converter 31 (step S5). If the peak value is not within the predetermined range (NO), N is incremented by 1 (step S6) and then a check is made to see if N has become a predetermined value, for example, 10 (step S7). If N is not 10 (NO), a calculation is made to know how many dB the signal level should be increased/decreased in order to make the signal level within the predetermined range (step S8). Then the calculation result is informed to the CPU 24 (step S9). In the step S9, the CPU 24 adds/subtracts the calculation result to/from the mid point value GM of the control range of the gain G of the variable gain amplifier 15 and then the process returns to the step S2.

In the step 5, if the peak value is within the predetermined range (YES), the CPU 24 is informed that the reference level has been set and the process ends (step S10). In the step S7, if N has become the predetermined value (YES), the CPU 24 is informed that N has become the predetermined value (step S11). In the step S11, the CPU outputs an error indication indicating that the reference level has not been properly set and the process ends.

Further, as mentioned above, even if the peak value of the digital data is judged to be within the full scale of the AD converter 31, the input signal level may sometimes be distorted in the frequency converter 13. A crest factor (a ratio of signal peak value to a power) is roughly determined depending on a communication mode such as, for example, GSM (Global System for Mobile communications), DECT (Digital Enhanced Cordless Telecommunications), CDMK (Code Division Multiple Access) or the like. Therefore, the gain of the substantially gain fixed amplifier 32 is adjusted for each communication mode such that when a signal having a proper level is inputted to the frequency convertor 13, the input of the AD converter 31 is optimized (the peak level of the digital data is within the range of 85%–65% of the full scale of the AD converter 31).

In addition, if the input signal is a burst wave, the length of the data to be taken into the memory 35 is determined such that the entire length of the bust wave is taken into the memory 35. For example, in the case of GSM, since a bust signal of 0.57 ms exists within 4.165 ms, the input signal is taken for a period of 4.165 ms to detect a peak value of the burst signal. In the case of DECT, the input signal is acquired for a period of 10 ms. In the case of a continuous wave, the input signal is acquired for a predetermined time length.

After a reference level is set as described above, a measurement of, for example, carrier power of the input signal is performed. Here, assuming that, in the state that the reference level is set, the number of digital data taken into the memory 35 is n, each of the digital data values is Di (i=1, 2, . . . , n), a set attenuation amount of the variable attenuator 12 is ATT (dB), a set gain of the variable gain amplifier 15 is G (dB), a difference (correction value) between an amount of the set values of the variable attenuator 12 and the variable gain amplifier 15 and an amount of the actual values of the attenuation and the gain is CAL (obtained by a calibration in advance and calibrated again if necessary), the carrier power Pc is calculated by the following formula.

$$Pc = 10 \log\left(\sum_{i=1}^{n} \frac{Di^2}{n}\right) + ATT + G + CAL$$

Further, the gain of the half fixed amplifier 32 is included in CAL.

The variable attenuator 12 may be varied in the unit of 10 dB. The changeable unit of gain of the variable gain amplifier is sufficiently smaller than that of the variable attenuator 12. Even when an input level is smaller than 0 dB, ATT may sometimes be fixed to 10 dB. In this case, in the initialization in the step 1 of FIG. 2, ATT is set to ATT=10 dB.

A measuring method of a carrier power in some communication modes has already been defined. In this case, a carrier power is measured in accordance with the defined measuring method. For example, in the case of GSM, by the DSP 36, a burst portion is extracted from a digital data read out from the memory 35 and is demodulated. Then a synchronizing word is detected from the demodulated data. Then the carrier power is calculated using a digital data section of 62 bits–148 bits (referred to as a useful Part) preceding the synchronizing word. This process is defined in a standard.

In the case of the input data in DECT, the carrier power is calculated using a digital data having a burst length starting from the front position of the synchronizing word. In PDC (Personal Digital Cellular), an average power of one frame is calculated and the average power is multiplied by 20/6.25 to obtain a carrier power for duration of burst ON.

Next, in the case of measuring a spurious power or a leakage power to adjacent channels, a measured carrier power Pc is informed to the CPU 24, where the carrier power Pc is set as a reference level of the spectrum analyzer, and the input signal is measured in a sweep mode. This measured output, i.e., the output of the video band filter 21 shown in FIG. 1 is supplied to the display 22, where a waveform shown in FIG. 3 as, for example, a curve 41 is displayed. In other words, the most general spectrum indication is displayed.

Figure 3:
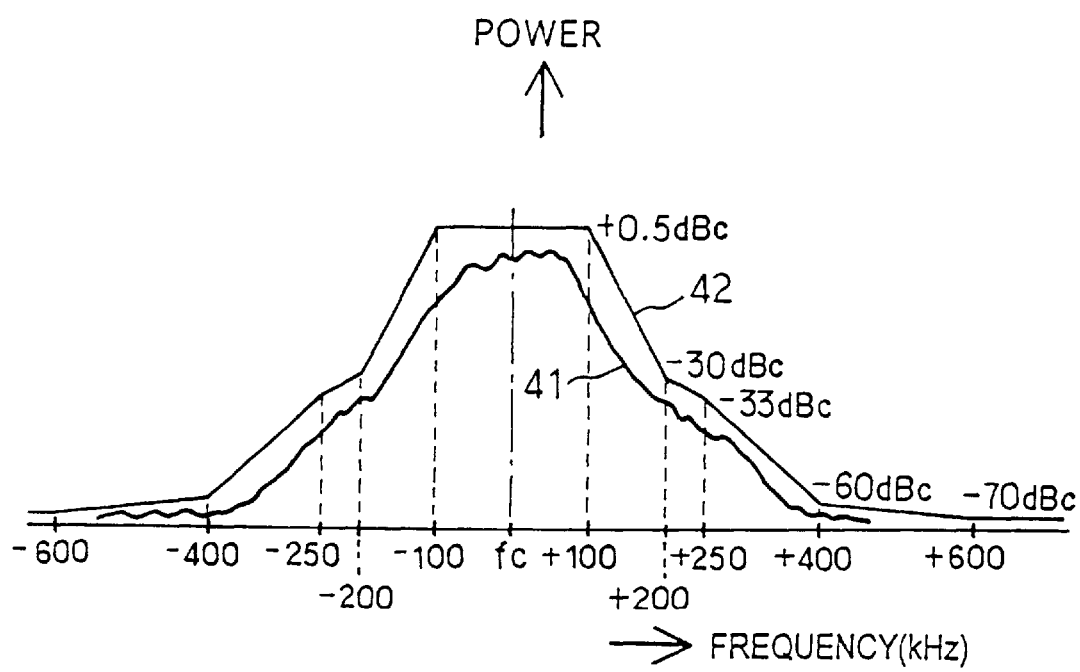
FIG. 3 is a diagram showing an example of an overlapping display of a template and a measured spectrum.

In the example of FIG. 3, a standardized template 42 is displayed and overlaid on the curve 41 based on the measured carrier power Pc. In the case of GSM, as illustrated, when the carrier power Pc is equal to or larger than 43 dBm, the input signal power is 0.5 dBc at the frequencies ±100 kHz apart, −30 dBc at the frequencies ±200 kHz apart, −33 dBc at the frequencies ±250 kHz apart, −60 dBc at the frequencies ±400 kHz apart, and −70 dBc at the frequencies ±600–1200 kHz apart from the carrier frequency fc, respectively. A curve depicted by connecting these points by straight lines is the standardized template shown in FIG. 3 as the curve 42.

If a measured spectrum power curve 41 is, as illustrated, in the inside (lower side) of the template 42, the input signal is determined to be good in terms of its spurious power and leakage power to adjacent channels. If the measured spectrum power curve 41 has a portion or portions out of the template 42, the input signal is determined to be no-good in terms of its spurious power and leakage power to adjacent channels.

In addition to the comparison of the measured spectrum value with a template as described above, a spurious power and/or a leakage power to adjacent channels at a predetermined frequency are measured and the measured values and the carrier power Pc may numerically be displayed. Alternatively, a difference between each measured value and the carrier power Pc may also be displayed. Further in this case, it may also be displayed whether or not each difference value satisfies the standard.

Figure 4:
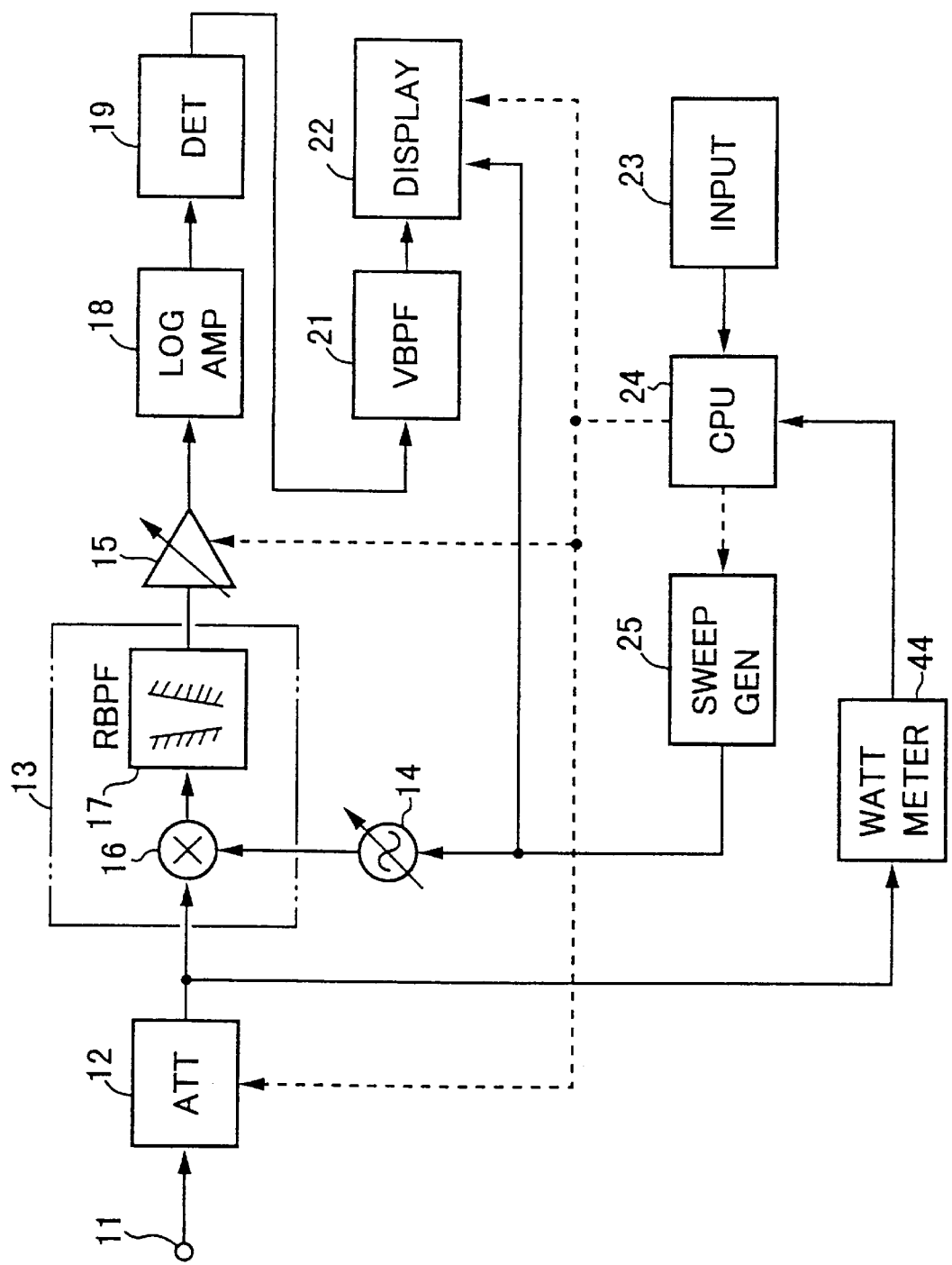
FIG. 4 is a block diagram showing a specific example of a spectrum analyzer to which a second embodiment of the measuring method according to the present invention is applied.

FIG. 4 is a block diagram showing a specific example of a spectrum analyzer to which a second embodiment of the measuring method according to the present invention is applied. Portions or elements in FIG. 4 corresponding to those in FIG. 1 have the same reference characters affixed thereto as those in FIG. 1 and the explanation thereof will be omitted unless it is necessary.

The spectrum analyzer shown in FIG. 4 is constructed such that an input signal is branched from the front stage side of the frequency converter 13 and is inputted to a power meter 44, where the carrier power of the input signal is measured and the measured power value is informed to the CPU 24. Also in this case, the CPU 24 sets the informed carrier power as a reference level.

Since it is apparent that the same function and effect as in the previous embodiment can also be obtained by the above construction, the explanation thereof will be omitted.

As apparent from the above explanation, according to the present invention, since a reference level of a spectrum analyzer can automatically be set, time length and workload for setting a reference level can significantly be reduced.

In addition, since a measured value of a carrier power is calculated based on a digital data converted from an input signal, repetitive sweep calculations are not required, and hence the measuring time can be reduced. Moreover, the measurement is not influenced by errors of the logarithmic amplifier 18 and the detector 19, and hence a carrier power can be calculated accurately. Depending on the communication mode, for example, a power of only useful Part can be measured from a demodulated data. That is, a standardized carrier power can be measured accurately.

Upon the measurement of a spurious power and a leakage power to adjacent channels, a carrier power is set as a reference level, and hence the dynamic range can be increased.

What is claimed is:

1. A measuring method using a spectrum analyzer comprising the steps of:
    branching an output of a frequency converter in said spectrum analyzer;
    converting the branched output into digital data using an AD (analog-digital) converter;
    checking to see whether the AD converter is in overflow condition or not;
    adjusting signal levels in the spectrum analyzer, when the AD converter is in overflow condition, to prevent the AD converter from overflowing; and
    displaying a spectral representation of the output of the frequency converter, wherein a measuring central frequency of the spectrum analyzer selected by the frequency converter is set to a carrier frequency of an input signal and a sweep of measuring frequencies is stopped, thereby to calculate a carrier power of the input signal from the digital data.

2. The measuring method using a spectrum analyzer according to claim 1, further comprising the step of:
    adjusting an output level of the frequency converter, after said adjusting of the signal levels in the spectrum analyzer, by a unit smaller than the unit of adjusting the signal levels in the spectrum analyzer such that a peak value of the digital data falls within a predetermined range in a full scale of the AD converter.

3. The measuring method using a spectrum analyzer according to claim 2, wherein measuring frequencies are swept in the state that the measuring central frequency is set to the carrier frequency of the input signal to measure a spurious power or a leakage power to adjacent channels.

4. The measuring method using a spectrum analyzer according to claim 3, wherein during the measurement by sweeping the measuring frequencies, the measured carrier power is set in the spectrum analyzer as a reference level thereof.

5. The measuring method using a spectrum analyzer according to claim 3, wherein a standardized template in accordance with the input signal is displayed based on the carrier power, and power values measured by sweeping the measuring frequencies are displayed superposed upon the template.

6. The measuring method using a spectrum analyzer according to claim 5, wherein during the measurement by sweeping the measuring frequencies, the measured carrier power is set in the spectrum analyzer as a reference level thereof.

7. The measuring method using a spectrum analyzer according to claim 1, wherein measuring frequencies are swept in the state that the measuring central frequency is set to the carrier frequency of the input signal to measure a spurious power of a leakage power to adjacent channels.

8. The measuring method using a spectrum analyzer according to claim 7, wherein during the measurement by sweeping the measuring frequencies, the measured carrier power is set in the spectrum analyzer as a reference level thereof.

9. The measuring method using a spectrum analyzer according to claim 7, wherein a standardized template in accordance with the input signal is displayed based on the carrier power, and power values measured by sweeping the measuring frequencies are displayed superposed upon the template.

10. The measuring method using a spectrum analyzer according to claim 9, wherein during the measurement by sweeping the measuring frequencies, the measured carrier power is set in the spectrum analyzer as a reference level thereof.

11. A measuring method using a spectrum analyzer comprising the steps of:
    branching an output of a frequency converter in said spectrum analyzer;
    converting the branched output into digital data using an AD (analog-digital) converter;
    checking to see whether the AD converter is in overflow condition or not;
    adjusting signal levels in the spectrum analyzer, when the AD converter is in overflow condition, to prevent the AD converter from overflowing; and
    displaying a spectral representation of the output of the frequency converter, wherein the digital data is demodulated and based on the demodulated data, a carrier power is calculated for the digital data of a sample predetermined with respect to the input signal.

12. The measuring method using a spectrum analyzer according to claim 11 further comprising the step of:
    adjusting an output level of the frequency converter, after said adjusting of the signal levels in the spectrum analyzer, by a unit smaller than the unit of adjusting the signal levels in the spectrum analyzer such that a peak value of the digital data falls within a predetermined range in a full scale of the AD converter.

* * * * *